United States Patent [19]
Hnat et al.

[11] Patent Number: 5,399,972
[45] Date of Patent: Mar. 21, 1995

[54] SPARK INTENSITY TRANSIENT PEAK VOLTMETER FOR SECONDARY IGNITION CIRCUIT TESTING MOUNTED IN DASHBOARD

[76] Inventors: Stephen P. Hnat, 42 Elaine St., Thompson, Conn. 06277; Ronald H. Sorel, 108 Hartford Rd., Brooklyn, Conn. 06234

[21] Appl. No.: 888,510

[22] Filed: May 27, 1992

[51] Int. Cl.$^6$ ............................................. F02P 17/00
[52] U.S. Cl. ..................................... 324/399; 324/402
[58] Field of Search ............... 324/378, 380, 393, 399, 324/402; 364/551.01

[56] References Cited

U.S. PATENT DOCUMENTS

| | | | |
|---|---|---|---|
| 3,028,543 | 4/1962 | Parmater et al. | 324/399 X |
| 3,898,876 | 8/1975 | Miceli | 73/117.3 |
| 3,961,240 | 6/1976 | Pohl | 324/402 X |
| 4,291,383 | 9/1981 | Tedeschi et al. | 364/551 |
| 4,337,515 | 6/1982 | Kreft | 364/551 |
| 4,490,799 | 12/1984 | Marino et al. | 364/551 |
| 5,001,432 | 3/1991 | Wixon | 324/402 |
| 5,043,659 | 8/1991 | Lowmiller et al. | 324/402 X |
| 5,065,729 | 11/1991 | Krauter et al. | 324/380 X |

FOREIGN PATENT DOCUMENTS 3705692 9/1988 Germany.
3709049 9/1988 Germany.

*Primary Examiner*—Gerard R. Strecker
*Assistant Examiner*—Warren S. Edmonds
*Attorney, Agent, or Firm*—James Creighton Wray

[57] ABSTRACT

A secondary ignition voltage peak meter provides an indication of ignition operation. A capacitive sensor picks up secondary ignition voltage, and an inverting amplifier reduces and inverts that voltage to a second signal. The second signal is conducted to first and second signal storage circuits and is respectively stored as third and fourth signals. Signal from the second storage device is provided to a second amplifier and converted to an on-off gating signal. The signal from the first storage device is provided to a first power terminal of a field effect transistor, and the gating signal is provided to the gate terminal. A third storage device is connected to a second power terminal of the FET, and a third amplifier is connected to the third storage device to provide an output which is moved by a capacitor and adjusted by a potentiometer. The output signal is delivered to a display driver, and the display driver converts the signal to a sensible signal of good, fair and poor ignition operation.

3 Claims, 5 Drawing Sheets

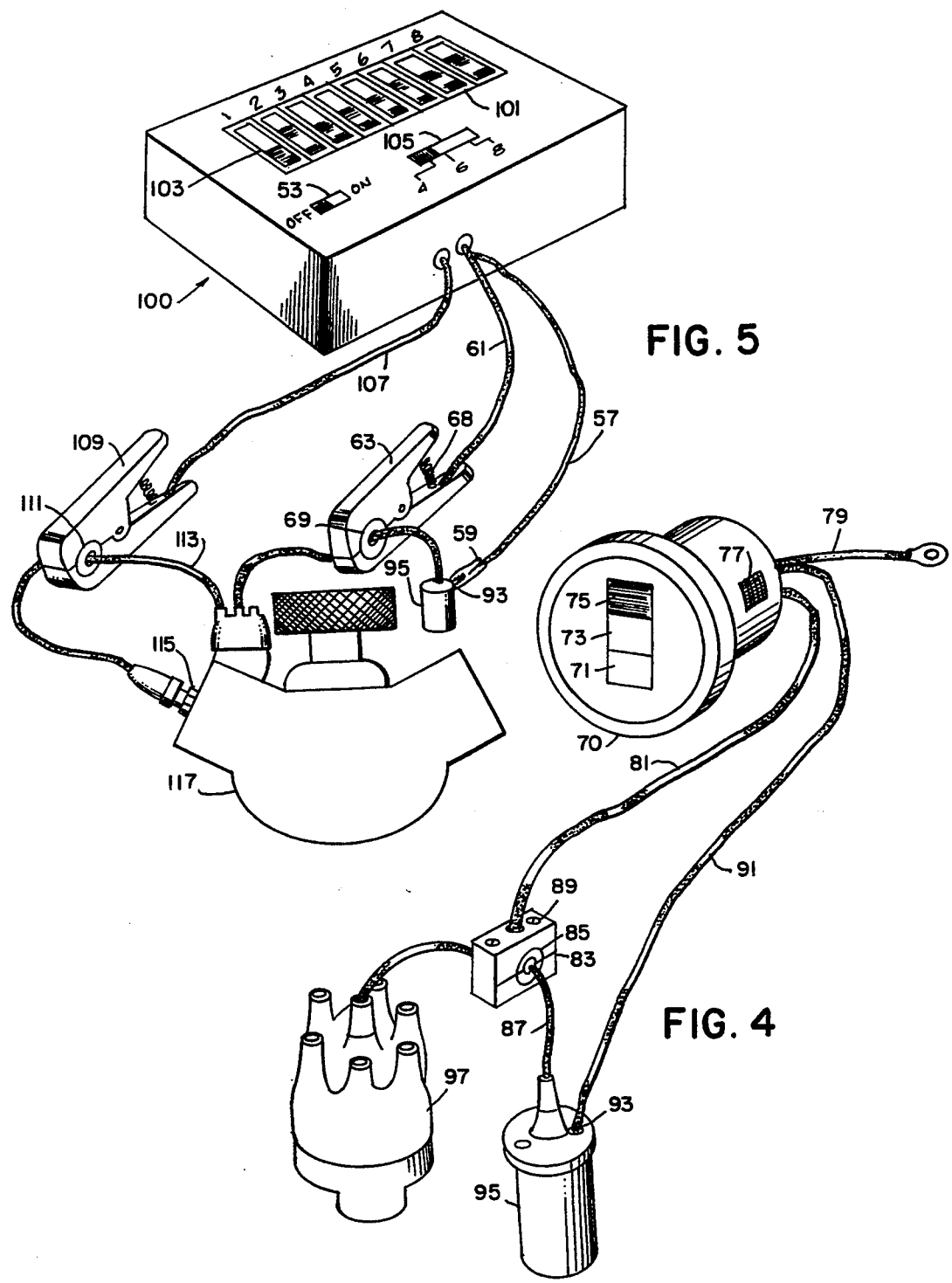

SPARK INTENSITY TRANSIENT PEAK VOLTMETER FOR SECONDARY IGNITION CIRCUIT TESTING MOUNTED IN DASHBOARD

BACKGROUND OF THE INVENTION

Engine ignition system operation is critical to good fuel economy and low pollutant output from internal combustion engines. Millions of dollars are spent in increasing fuel economy and reducing pollutant outputs, especially products of incomplete combustion. A properly tuned engine requires optimal ignition operations.

When an engine runs well, it is difficult to determine when the ignition system is operating in a range which results in poor fuel efficiency and increased output of incomplete combustion products.

When an engine is running poorly, it is difficult to quickly detect whether the poor operation is due to ignition or other engine operations such as problems in fuel supply, valve functions or other conditions.

A need exists for a system to provide quick information to a vehicle owner, to an engine operations analyst and to a garage mechanic, on the proper, marginal or improper working of an automotive ignition system. A need exists to provide repeated useful information to the operator of a vehicle, and needs exist to provide small portable systems for supplying rapid screening information to vehicle inspectors.

SUMMARY OF THE INVENTION

The present invention overcomes the deficiencies of the prior art and supplies the long needed small, portable ignition system checking devices by providing systems for secondary system sample analysis and transient peak voltmeters which sample spark voltage and reveal whether the voltage is in an efficient level.

A secondary ignition voltage peak meter provides an indication of ignition operation. A capacitive sensor picks up secondary ignition voltage, and an inverting amplifier reduces and inverts that voltage to a second signal. The second signal is conducted to first and second signal storage circuits and is respectively stored as third and fourth signals. A signal from the second storage device is provided to a second amplifier and is converted to an on-off gating signal. The signal from the first storage device is provided to a first power terminal of a field effect transistor (FET), and the gating signal is provided to the gate terminal. A third storage device is connected to a second power terminal of the FET, and a third amplifier is connected to the third storage device to provide an output which is smoothed by a capacitor and adjusted by a potentiometer. The output signal is delivered to a display driver, and the display driver converts the signal to a sensible signal of good, fair and poor ignition operation.

An automotive secondary ignition circuit transient peak voltmeter has a pickup for attaching to a source of secondary ignition voltage for providing a first voltage signal representative of the voltage in the secondary ignition circuit. An inverting amplifier is connected to the pickup for receiving the first signal and converting the first signal to a second signal of inverted and reversed voltage. A first storing circuit is connected to an output of the inverting amplifier for storing a peak portion of the second signal as a third signal. A second signal storage device stores a peak portion of the second signal as a fourth signal. A signal comparator amplifier is connected to the output of the inverting amplifier and to the second signal storage device for producing a fifth gating signal. An electronic switch has a first power terminal connected to the first signal storage device and has a gate terminal connected to an output of the signal comparator for connecting the first power terminal to a second power terminal when the output of the comparator turns the gate on. A third signal storage device is connected to the second power terminal of the electronic switch. A third amplifier is connected to the third storage device for providing a seventh signal. A power divider is connected to the output of the third amplifier for setting power level output, and a display driver is connected to the power divider for supplying power to a display. A display is connected to the display driver.

A preferred hand held secondary ignition tester has a control box and an off-on switch. A power supply is connected to the control box. A circuit within the box samples and holds signals related to transient secondary ignition voltage peaks. A sensor cable is connected to the circuit and a secondary voltage sensor pickup is connected to the sensor cable. A display is connected to the box for displaying signal level and thereby displaying a representation of transient peak voltage and ignition system condition.

A ground line is connected to the circuit and connected to a ground clip for connecting to an engine ground.

A synchronization cable is connected to the circuit and is connected to a synchronization pickup for connecting to a high voltage wire between the No. 1 distributor port and the No. 1 cylinder spark plug. The display comprises multiple displays for up to eight cylinders. The circuit includes a multiplexer connected to the multiple displays. A switch is connected to the box and to the circuit for selecting the number of cylinders.

A capacitive sensor senses secondary ignition voltage, for example, on a line between the coil and distributor in the ignition circuit of an internal combustion engine. Capacitors and resistors limit the input signal to an inverting amplifier, which produces an output signal with peaks of about 3 volts. The output signal is fed to a first storage peak integrator and is fed to a second storage peak detector. The output of the peak detector is supplied to an amplifier, which produces peak interval timing pulses used to gate an electronic switch for supplying the peak integrator signals to a sample holdout storage. The sample holdout signal is supplied to a display driver for producing a signal.

These and further and other objects and features of the invention are apparent in the disclosure, which includes the above and ongoing written specification, with the claims and the drawings.

BRIEF DESCRIPTION OF THE DRAWINGS

FIG. 4 shows installation of the meter in an automobile.

FIG. 5 shows a digital readout meter for multicylinders.

DETAILED DESCRIPTION OF THE DRAWINGS

Figure 1:
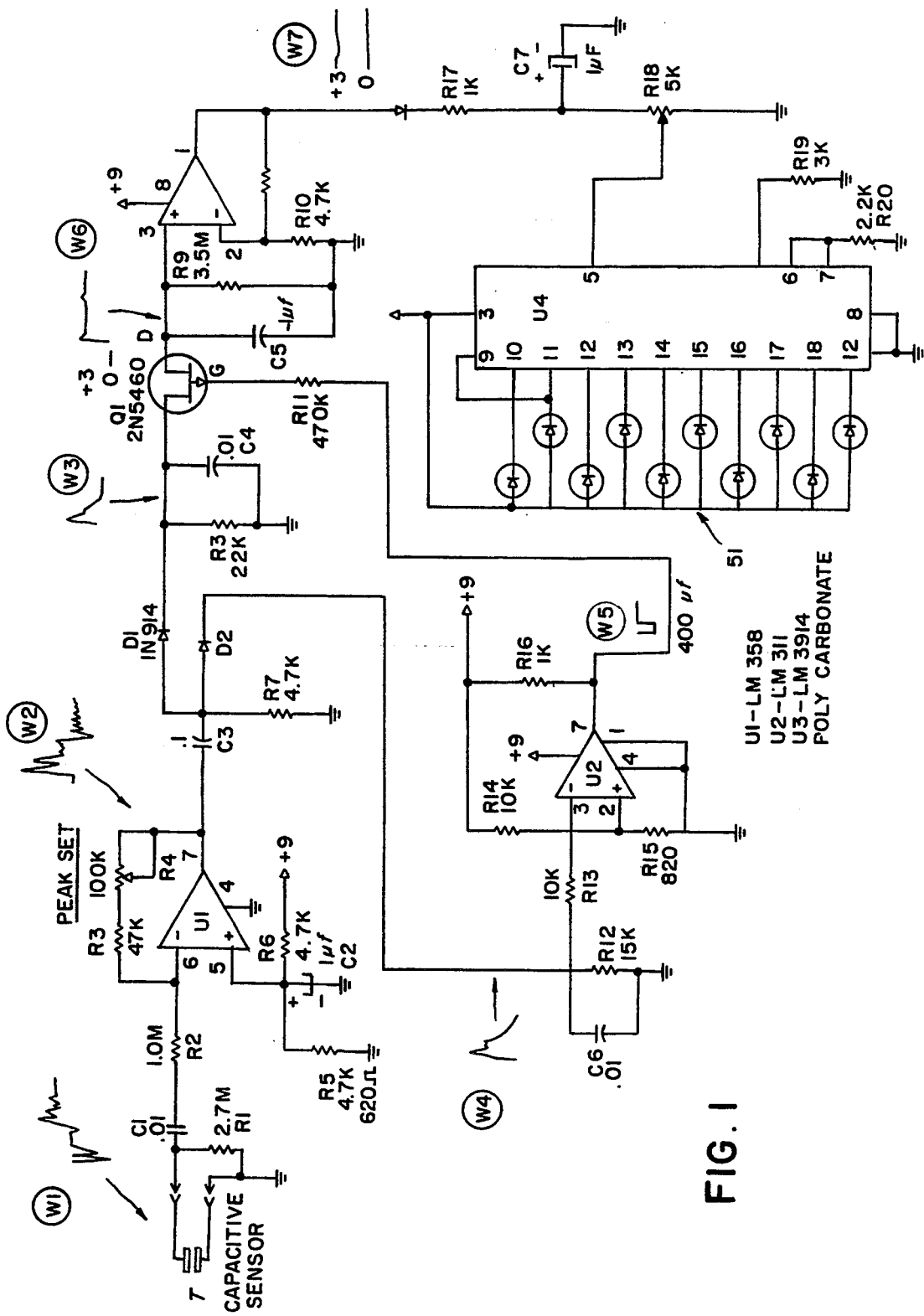
FIG. 1 is a schematic circuit diagram of a preferred transient peak amplitude measurement circuit of the present invention.
Figure 2:
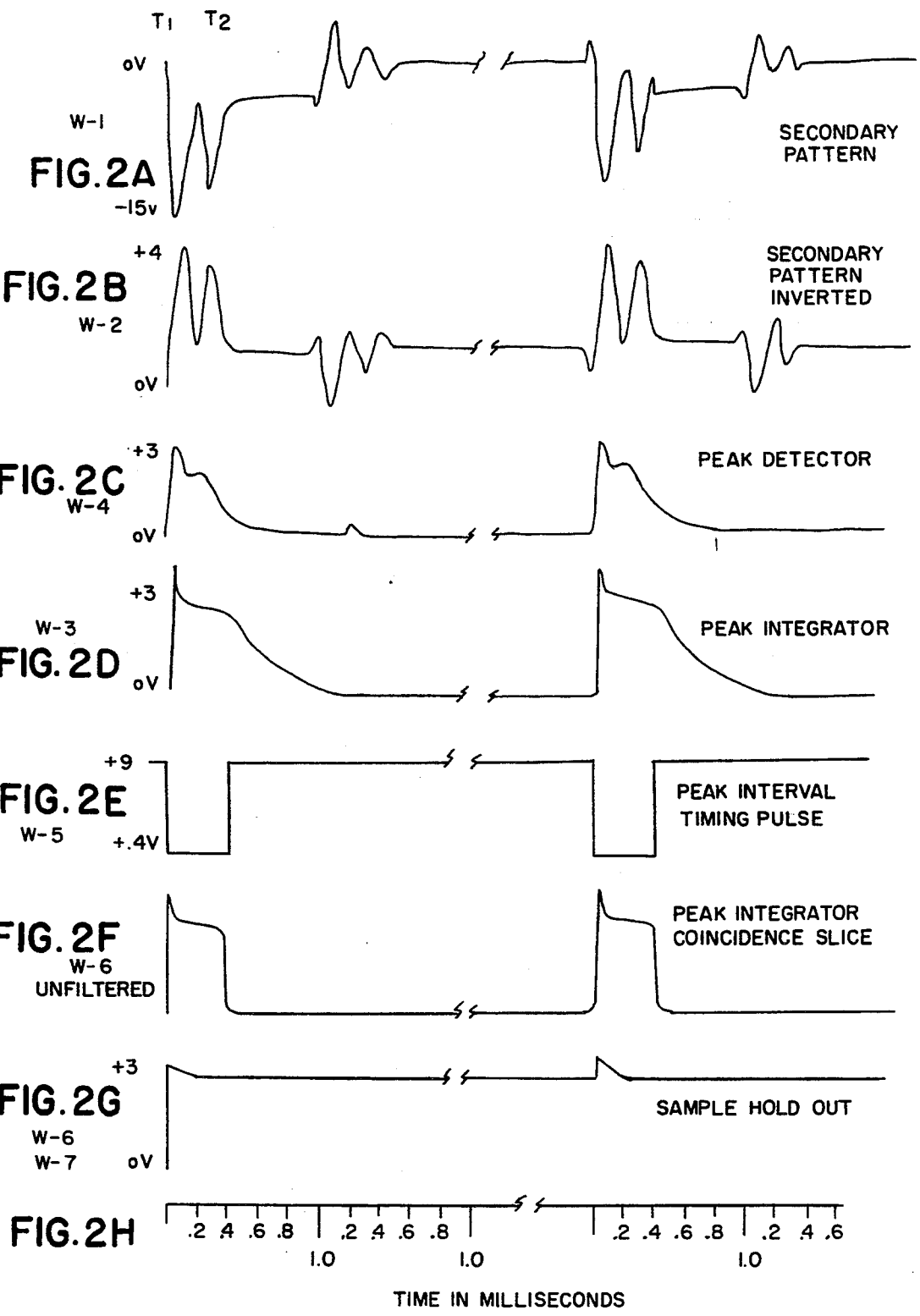
FIGS. 2A–2G show wave forms in the circuit of FIG. 1.
FIG. 2H shows timing intervals of the wave forms shown in FIGS. 2A–2G.

Referring to FIG. 1 and 2A-2H, a capacitor sensor T is placed near a coil output wire in an ignition system. Capacitor C1 and resistors R1 and R2 provide a normal signal, which has peaks of about −15 volts and the complete secondary pattern referred to as wave form signal W1 as shown in FIG. 2A, to the negative input on pin 6 of the inverting amplifier U1. The positive input pin 5 is connected to a 9 volt supply through resistor R6, and to ground through parallel capacitor C2 and resistor R5. The operational amplifier output is controlled by feedback resistor R3 and variable resistor R4 to produce a peak secondary pattern inverted signal W2 shown in FIG. 2A. Capacitor C3 and resistor R7 have short time constants and behave as differentiators. Their purpose is isolation and ground return to facilitate zero crossing accuracy for D1 and D2. Negative voltages are prevented by diodes D1 and D2. The signal is sent to a first signal storage and decay circuit C4 and R8 in the peak integrator signal W3 shown in FIG. 2D. The signal fed to capacitor C6 which decays through resistor R12 is the peak detector wave form W4 shown in FIG. 2C. The peak detector signal is fed through resistor R13 to the negative input of operational amplifier U2. U2 also receives a +9 volt input. The positive input pin 2 of the operational amplifier U2 is connected to ground through resistor R15, and pins 1 and 4 are also connected to ground. The positive terminal at pin 2 also receives a 9 volt input through resistor R14 and feedback through resistors R14 and R16. Resistors R14 and R15 act as a voltage divider to control the input at pin 2. The output 7 of operational amplifier U2, which is configured as a comparator, produces a gating pulse varying between 9 volts and 0.4 volts, which is the peak interval timing pulse W5 shown in FIG. 2E. A positive base of the gating signal is provided by the 9 volt supply, which is reduced by resistor R16. Current limiting resistor R11 supplies the output to the gate G of the field effect transistor Q1.

As appears from FIG. 2H, the peak interval timing pulse is provided at the reduced voltage for intervals of about 400 microseconds. The gate controls the signal transfer from capacitor C4 to capacitor C6 through the power terminals on the field effect transistor. The signals are transferred through the transistor Q1 as peak integrator coincidence slices represented by the unfiltered wave form W6 shown in FIG. 2F.

The signal is fed to operational amplifier U3, which in a preferred embodiment is a second half of the dual amp op-amp formed by U1 and U3.

The signal is filtered by capacitor C5 and resistor R9, and is fed to the positive input pin 3 of the op-amp U3. The negative pin 2 is connected through a feedback current resistor i from the output pin 1, and is connected through resistor R10 to ground. The filtered output of op-amp U3 is a sample holdout wave form signal W7, having a level related to the peak level of the voltage signal input W1. Spikes are removed from the W7 signal by capacitor C7, and voltage is smoothed and reduced by resistor R17 and variable resistor R18, which supplies a ten segment LED drive U4. Pins 2 and 8 of U4 are connected to ground, and pins 6 and 7 are connected to ground through a resistor R20. A 9 volt potential is supplied at pin 3 and at each of the LEDs connected to terminals 1 and 10-18. Resistance within the integrated circuit drive varies so that the LEDs sequentially light, according to the control voltage value of wave form W7 as applied to potentiometer R18.

The LEDs are generally referred to by the numeral 51. In the circuit shown in FIG. 1, U1 and U3 are parts of a dual operational amplifier LM 358. U2 is an operational amplifier LM 311, and U4 is a ten segment LED driver LM 3914.

Figure 3:
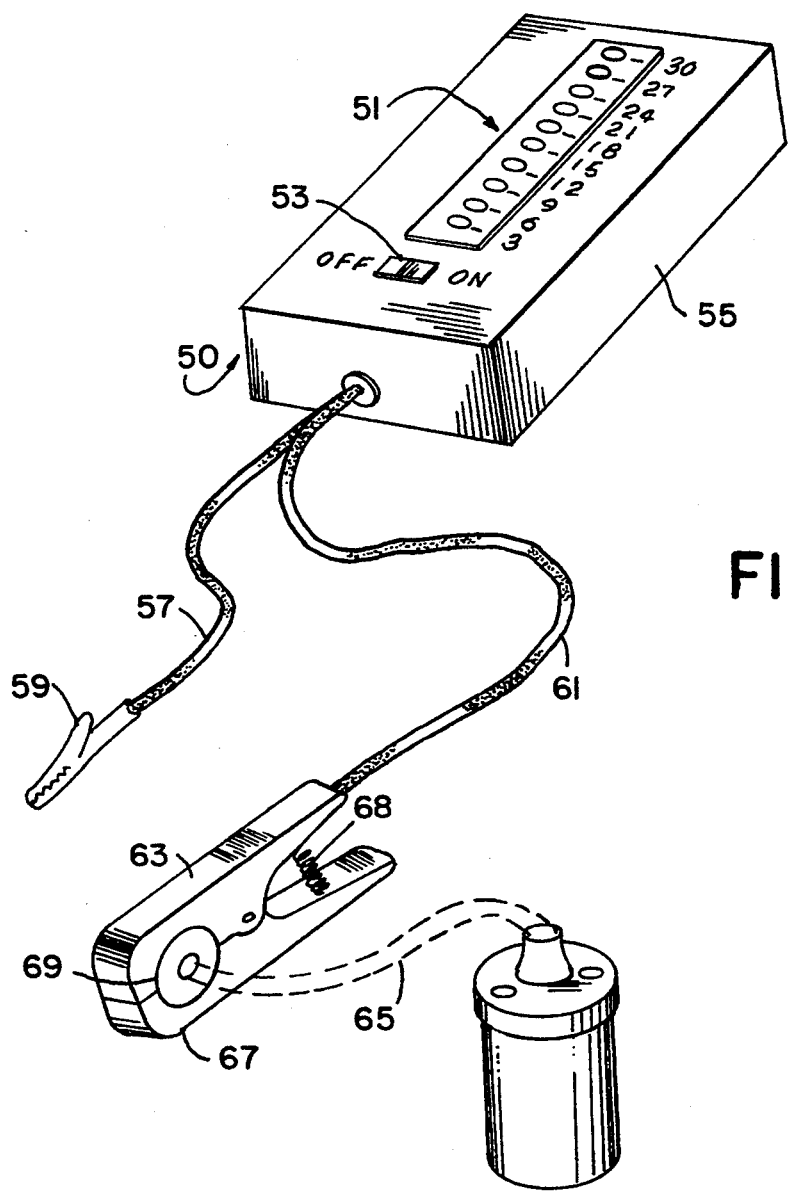
FIG. 3 is a schematic representation of a meter.

As shown in FIG. 3, a preferred simplified meter is generally indicated by the numeral 50. The LEDs are collectively indicated by the numeral 51, and the small numerals opposite the LEDs are measurements in kilovolts.

When the switch 53 is turned on, if only the LED by the 3 kilovolt indicator or the two LEDs by the 3 and 6 kilovolt indications are turned on, that is an indication that the plug gaps are too tight or there is a short or unwanted grounding, such as through leaky ignition wires. A good range is in the 9 to 12 kilovolt range, when the bottom three or four LEDs are illuminated. The LEDs by the 9 and 12 kilovolt indications may be green LEDs. When the LEDs opposite the 15 and 18 kilovolt markings are illuminated, that is an indication that the ignition system is in poor condition, and suggests improvement by a tune-up. Those LEDs may be yellow LEDs. When in addition to the previous LEDs the LEDs by the 21, 24, 27 and 30 kilovolt markings are illuminated, a bad ignition condition is indicated which suggests plug fouling or too large gaps. The top four LEDs preferably are red LEDs. As shown, the hand held box 55 has dimensions of about 5"×3"×1". A ground wire 57 with a grounding clip 59 is led from the box. Conventionally the grounding clip may be connected to the negative terminal on the ignition coil. Lead 61 extends from the box 55, and a clamp 63 at the distal end of the lead 61 engages the coil-distributor wire 65. The clamp has jaws 67 urged together by spring 68 to hold the two halves of the capacitive pickup 69 on the wire.

As shown in FIG. 4, a meter 70 is configured for mounting on an automobile dashboard. The meter has three lamps 71, 73 and 75 which are indicative of good condition of the ignition system, a need for a tune, and an EPA warning, respectively. The system also has an audible alarm 77 which may be programmed to sound intermittently or after the ignition is turned on for a brief period when the system is either in the red or yellow condition. The alarm 77 may sound for a longer time when the system is in a red EPA warning condition, and for a shorter time when the system is in a yellow tune-up condition. A wire 79 is provided with a connector to a 12 volt main. A sensor cable 81 connects the meter with a clamp 83, which permanently clamps the sensors 85 on the wire 87 with screws 9. The system may also have a grounding wire 91 which connects to the negative terminal 93 on the auto ignition coil 95, which supplies the distributor 97 with the high secondary ignition voltage through cable 87.

As shown in FIG. 5, another preferred form of a meter 100 has eight LED displays 101, each with ten segment LED displays 103. A cylinder number selection switch 105 is moved to the correct number of cylinders before turning on the switch 53. A synchronization cable 107 has a clamp 109 which holds capacitive pickups 111 on the spark plug wire 113 from the distributor 97 to the number 1 cylinder spark plug 115 on engine 117.

Figure 6:
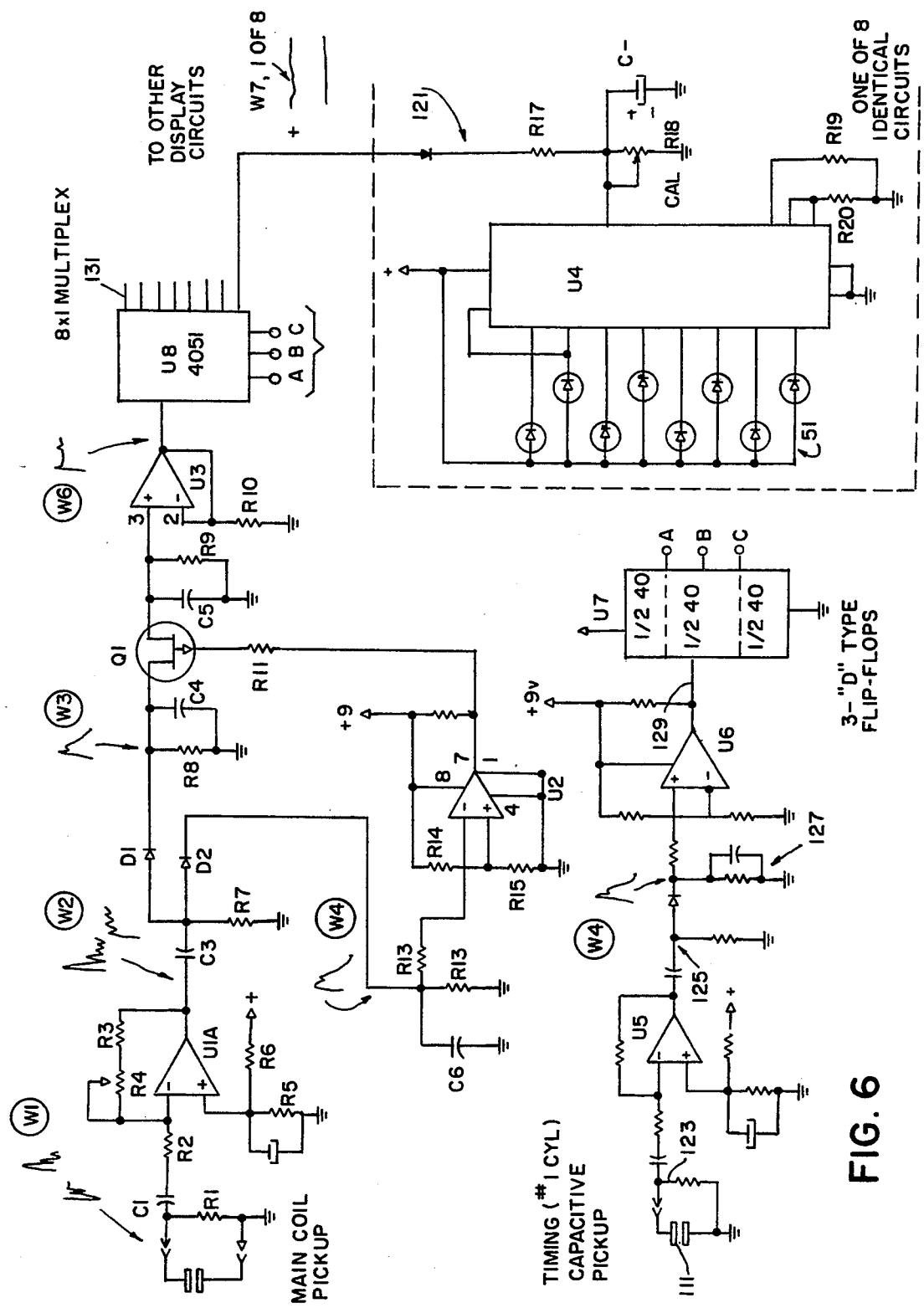
FIG. 6 is a schematic representation of a meter circuit for multiple cylinder peak voltage displays.

The circuit in FIG. 6 is similar to the circuit in FIG. 1, with the exception that the output of operational amplifier U1 is connected to an 8×1 multiplexer, for example a Motorola MC14051BCP, which has eight outputs to the eight display circuits. The display circuits 121 are identical to the display circuit described in FIG. 1. Eight separate identical display circuits are provided. Each of the display circuits controls an array of LED indicators 103 in one of the eight cylinder indications 101, as shown in FIG. 5. Binary inputs A, B and C on multiplexer U8 are connected to binary outputs A, B and C on the three D-type flip-flops of Motorola Type 4024 of binary divider U7. The capacitive pickups 111 are connected to the capacitance resistance voltage divider circuit 123 to the negative input of op-amp U5, which inverts and reduces the voltage in a manner similar to op-amp U1. The capacitance and resistance circuit 125 creates the W4 peak detector wave form in cooperation with the capacitance resistance circuit 127. Op-amp U6 operates in a manner similar to op-amp U2 to provide a binary timing pulse on line 129 which is supplied to the binary divider U7, which provide then binary outputs corresponding to A, B and C which are supplied to op-amp U8 to provide the smoothed sample holdout signal W6 to one of the outputs 131, according to which cylinder is receiving the corresponding ignition secondary voltage at that time. The result is to provide a signal W7 to one of the display drivers U4. The signal level is held by the capacitor C7 to maintain illumination of the appropriate LEDs from the array 51.

The operation of the circuit shown in FIG. 1 is shown by the wave forms and timing in FIGS. 2A–2H. U1 is a low gain inverting amplifier with a gain structure between 0.15 and 0.05, depending on resistor R3 and the adjustment of R4. U1 acts as an inverting amplifier.

The electrostatic charge on the capacitive sensor transducer T is such that the wave form W1 application at terminal 6 of amplifier U1 begins with a negative transition of about −20 volts peak. Resistor R1 provides loading for the transducer and may be used to trim the overall input sensitivity. Capacitor C1 provides DC isolation for amplifier U1. Resistors R4 and R6 bias amplifier U1 slightly above Class B operation, such that the full positive voltage swing may be realized at the output of amplifier U1.

Capacitor C3 provides DC isolation and is returned to ground by resistor R7.

The positive output transition at pin 7 of amplifier U1 at time T1 represents the point at which the ignition coil saturating current is terminated and combustion is initiated by the counter EMF induced into the ignition coil by its collapsing field. As this voltage rises, a point will be reached whereby the dielectric strength of the medium between the spark gap will be exceeded, and coil energy will be dissipated across the plug gap. That flash point is reached on the leading edge of the coil secondary voltage. The time interval of that initial discharge is less than 10 microseconds. That is the only time period the secondary peak amplitude measurement is valid and is directly related to the dielectric strength of the ignition system (leakage) and the gap resistance.

The total discharge time after initial firing is typically 2 milliseconds below 2000 RPM. The present invention is primarily concerned with the required peak initiation voltage and the variation of peak initiation voltage as a result of plug and ignition system variation. Carburation will also affect the dielectric strength of the plug gap, and as a result will show up in the final analysis.

The output of the inverting amplifier U1 at pin 7 with the wave form W2 is rectified by both diodes D1 and D2, and is fed to different time constants made up of resistor R8 and capacitor C4, and resistor R12 and capacitor C6. The time constant of R12 and C6 is slightly shorter than the time constant of R8 and C4. R12 and C6 determine how long the peak ignition voltage will be sampled. The differentiated wave form W4 at R12, C6 is fed to the voltage comparator U2 and resistors R14 and R15. R14 and R15 bias comparator U2, such that the output at pin 7 is high as a result of no current through R16. When the wave form W4 reaches the voltage level present at the negative input pin 2 of the comparator U2, current flow through resistor R16 is at a maximum until the input at pin 3 reaches that point again at time T2. The resultant wave form W5 is a 300 microsecond transition beginning at time T1 from the positive supply rail, and going to 0.4 V DC above ground until time T2, when that voltage again returns to the positive supply rail. Wave form W5 is used to turn on the field effect transistor (FET) switch Q1 between the time T1 and T2. When Q1 is on, the voltage present at capacitor C4 is transferred to capacitor C5 during the time T1 to T2. After T2, the voltage is held by the long time constant capacitor C5 and resistor R9.

Resistor R8 presents a low impedance source to transistor Q1, which during time T1 to T2 will also discharge capacitor C5 to the new W3 voltage level.

The held voltage at capacitor C5 is applied to amplifier U3 to provide a low impedance drive source for the display circuit. Resistor R18 is used to calibrate the display against a known voltage reference of 30 KV full scale.

The display may be either a ten segment display shown, which uses an LM 3914 display driver U4 which is comprised of 10 comparitors with an appropriate linear ladder voltage divider network on the chip U4, or a simpler three segment display may be used to show good, fair and poor designated indications. An analog to digital converter displays the actual value of the secondary ignition circuit voltage in kilovolts. An analog to digital converter may be used to convert the information to alphanumeric information.

The invention may be employed in an automobile or, more particularly, in a truck to show good ignition performance, preferably for a limited time after starting a car, and to show marginal or poor ignition performance during the operation of a car.

The eight cylinder model works as follows.

U5 and U6 operate in the same identical manner as U1 and U2. Similar components have the same designators. The capacitive probe at the input of U5 is connected to the No. 1 cylinder.

The input signal at U1 will be a damped oscillation wave form as a result of ignition coil "ringing" and spark plug firing. This same wave form will appear at the input of U5. However, the pulse interval at U1 will be eight times greater than that at U5. This is due to the fact that in an eight cylinder engine the distributor divides or distributes the spark by a factor equal to the number of cylinders as a result of the number of lobes of the distributor cam on the main shaft through the distributor.

In an eight cylinder engine the actual pulse frequency of the coil, or the input of U1, would be equal to RPM divided by 15. In an example, an engine RPM of 600 converted to revolutions per second by dividing RPMs by 60 seconds in a minute yields 10 RPS.

The camshaft in an engine operates at one half the angular velocity of the crankshaft as a result of gear reduction. This gives us a cam cycle of 5 RPS. The distributor shaft is coupled 1:1 to the camshaft. In an eight cylinder engine there are eight lobes on the distributor camshaft which results in eight coil firings per distributor revolution, or in terms of pulse frequency, $5 \times 8 = 40$, or 40 cycles per second.

Taking the original RPM of 600 and dividing by 40 (the number of coil firings needed to sustain RPMs) yields a factor of 15.

For a six cylinder the divisor factor would be 20.

For a four cylinder the divisor factor would be 30, or twice that of an eight cylinder.

Wave form W5 is indicative of the coil firing interval as a result of the above. At the 600 RPMs of the example, the actual frequency of wave form W5 will be 40 Hz (Hertz, or cycles per second). The frequency at U6 (W8) will be equal to one eighth that of W5. That is due to the fact that the distributor rotor position for the No. 1 cylinder is coincident only once per distributor revolution.

Wave form W5 is fed to the clock input of U6, the 4024 CMOS binary frequency divider or counter. The reset input at pin 2 of U6 (W8) is that signal derived from the No. 1 cylinder which occurs at one eighth the frequency at the clock input, pin 1. That reset pulse ensures that the No. 1 display will always represent the No. 1 cylinder.

The resultant output from U7 is a binary code appearing at pins 12, 11 and 9. Those pulses when decoded to decimal by the "on chip" BCD (Binary Coded Decimal) decoder within U8, result in a sequential output from the 8×1 CMOS (Complimentary Metal Oxide Silicon) multiplexer integrated circuit, which is used as a de-multiplexer.

The sequential refresh voltages are passed along to the eight replicated display drivers, the displays of which are indicative of the individual spark voltages appearing at each cylinder.

The display circuit can be done in several different ways, such as using one display driver and multiplexing the display outputs, or converting voltage W7 to a digital code and using a numeric 7 segment display that presents a decimal equivalent from 0 to 99.

This circuit can be used in a 4 or 6 channel multiplexing scheme for use on 4 and 6 cylinder engines as well.

While the invention has been described with reference to specific embodiments, modifications and variations of the invention may be constructed without departing from the scope of the invention, which is defined in the following claims.

We claim:

1. A secondary ignition tester for mounting on an automobile dashboard comprising a control box connected to an ignition system of the automobile, a power supply of the ignition system connected to the control box, a circuit within the box connected to the power supply, a detector connected to the circuit for sampling, detecting and holding signals related to transient secondary ignition voltage peaks in the ignition system, a sensor cable connected to the circuit for coupling the detected signals and a secondary voltage sensor pickup connected to the sensor cable for detecting and relaying plural signal levels to the sensor cable, and a display connected to the box for selectively displaying at least one of the plural signal levels relayed by the sensor pickup through the sensor cable to the circuit in the box when the power supply is switched on, and wherein the signals displayed correspond to a representation of ignition transient secondary peak voltage and corresponding ignition system condition.

2. The apparatus of claim 1, further comprising a ground line connected to the circuit and connected to a ground clip for connecting to an engine ground.

3. The apparatus of claim 1, further comprising a synchronization cable connected to the circuit and connected to a synchronization pickup for connecting to a high voltage wire between a No. 1 distributor port and a No. 1 cylinder spark plug of the ignition system, and wherein the display comprises multiple display drivers and multiple displays for up to eight cylinders connected to the sensor pickup and wherein the circuit includes a multiplexer connected to the multiple display driver, and further comprising a selection switch connected to the box and to the circuit for selecting the number of cylinders for respectively displaying the condition of the selected cylinders.

* * * * *